(12) United States Patent
Shiratori

(10) Patent No.: US 9,136,493 B2
(45) Date of Patent: Sep. 15, 2015

(54) ORGANIC EL ELEMENT

(71) Applicant: PIONEER CORPORATION, Kanagawa (JP)

(72) Inventor: Masahiro Shiratori, Saitama (JP)

(73) Assignee: PIONEER CORPORATION, Kanagawa (JP)

( * ) Notice: Subject to any disclaimer, the term of this patent is extended or adjusted under 35 U.S.C. 154(b) by 0 days.

(21) Appl. No.: 14/527,445

(22) Filed: Oct. 29, 2014

(65) Prior Publication Data

US 2015/0060835 A1 Mar. 5, 2015

Related U.S. Application Data

(62) Division of application No. 13/392,293, filed as application No. PCT/JP2009/004477 on Sep. 10, 2009, now Pat. No. 8,895,964.

(51) Int. Cl.

| H01L 29/08 | (2006.01) |
| H01L 35/24 | (2006.01) |
| H01L 51/00 | (2006.01) |
| H01L 51/50 | (2006.01) |
| B82Y 10/00 | (2011.01) |
| H01L 51/52 | (2006.01) |

(52) U.S. Cl.
CPC ............ *H01L 51/5016* (2013.01); *B82Y 10/00* (2013.01); *H01L 51/50* (2013.01); *H01L 51/5092* (2013.01); *H01L 51/0046* (2013.01); *H01L 51/0081* (2013.01); *H01L 51/5221* (2013.01); *H01L 51/5237* (2013.01); *H01L 2251/5338* (2013.01); *H01L 2251/552* (2013.01)

(58) Field of Classification Search
USPC ............................................. 257/40; 438/46
See application file for complete search history.

(56) References Cited

U.S. PATENT DOCUMENTS

| 8,101,857 B2 | 1/2012 | Kido et al. |
| 2005/0098207 A1 | 5/2005 | Matsumoto et al. |
| 2006/0008740 A1 | 1/2006 | Kido et al. |
| 2009/0146556 A1 | 6/2009 | Fukuzaki |
| 2010/0237341 A1 | 9/2010 | Okumoto et al. |
| 2010/0276687 A1 | 11/2010 | Aratani et al. |

FOREIGN PATENT DOCUMENTS

| CN | 1620212 | 5/2005 |
| CN | 1719956 | 1/2006 |
| EP | 1530245 | 5/2005 |

(Continued)

OTHER PUBLICATIONS

International Search Report, PCT/JP2009/004477, Oct. 27, 2009.

(Continued)

*Primary Examiner* — Errol Fernandes
(74) *Attorney, Agent, or Firm* — Young & Thompson

(57) ABSTRACT

A technology having resistance to moisture and oxygen, and in which the occurrence and expansion of non-light-generating portions, such as dark spots, are suppressed is provided. An organic EL element in which an organic functional layer including at least one or more light-emitting layers is arranged between a first electrode and a second electrode, wherein the organic functional layer includes a bipolar charge generation layer which generates electrons and holes, and one of the first electrode and the second electrode is a hole-receiving electrode.

10 Claims, 5 Drawing Sheets

(56) References Cited

FOREIGN PATENT DOCUMENTS

| EP | 1617493 | 1/2006 |
|---|---|---|
| EP | 1865566 | 12/2007 |
| JP | 5-182759 | 7/1993 |
| JP | 8-96959 | 4/1996 |
| JP | 2005-135600 | 5/2005 |
| JP | 2005-166637 | 6/2005 |
| JP | 2006-024791 | 1/2006 |
| JP | 4243237 | 3/2009 |
| JP | 2009-152422 | 7/2009 |
| JP | 2009-152572 | 7/2009 |
| JP | 2009-184877 | 8/2009 |
| KR | 10-0880878 | 5/2005 |
| KR | 10-0880881 | 5/2006 |
| WO | 2009/147801 | 12/2009 |

OTHER PUBLICATIONS

Tapponnier et al., "Ultrapure C60 field-effect transistors and the effects of oxygen exposure", Applied Physics Letters 86, 112114 (2005), Nonlinear Optics Laboratory, Institute of Quantum Electronics, Swiss Federal Institute of Technology ETH-Zurich, CH-8093 Zurich, Switzerland.

ORGANIC EL ELEMENT

TECHNICAL FIELD

The present invention relates to an organic EL element and a production method thereof.

BACKGROUND ART

An organic EL (electroluminescence) element has a structure in which an organic functional layer including a light-emitting layer is sandwiched by an anode and a cathode. In this structure, when a voltage is applied, holes and electrons injected from the anode and cathode into the light-emitting layer recombine to self-emit light.

An organic EL element usually has low resistance to the oxygen and moisture in the air. Typically, the organic EL element will degrade, whereby a phenomenon occurs in which non-light-emitting portions known as "dark spots" occur and expand in the light-emitting region. Although there are various opinions regarding the mechanism in which dark spots occur, it is believed that one factor is the inhibition of the injection of electrons from the cathode into the adjacent organic layer due to oxygen, moisture and the like that have infiltrated into the element.

As the cathode material, to obtain good electron injection, a material having a low work function is used, such as Mg:Ag, Li:Al, Ca, and $Li_2O/Al$. Consequently, the cathode is easily oxidized by oxygen and moisture in the air. For example, if Al is used, AlOx is formed. Thus, depending on the material an insulating oxide film is formed. Dark spots occur due to reasons such as the cathode at a site that has been oxidized and degraded loses its function of injecting electrons, and localized increases in interfacial resistance.

Conventionally, one measure taken to suppress oxidation of the cathode has been to use a film sealing structure, in which the element is sealed by forming a thin film of a material having low permeability to oxygen and moisture, such as silicon nitride (SiNx). However, even if such a sealing structure is used, it is difficult to completely prevent the occurrence and expansion of dark spots due to the infiltration of oxygen and moisture from defective portions, such as pin holes and cracks. In particular, organic EL elements, which have the advantage that they can be formed on a flexible substrate such as plastic, suffer from the problem that cracks tend to form when the element is flexed.

Among conventional organic EL elements, a structure having a hole-electron current conversion layer in which an electron transport layer and a hole transport layer are laminated with a heat-reducible metal layer interposed therebetween, is known (for example, see Patent Literature 1). This hole-electron current conversion layer is provided to efficiently convert a hole current into an electron current. However, a heat-reducible metal such as Al is also easily oxidized like the cathode, so that there is the problem that if an oxide film is formed, the hole-electron current conversion efficiency deteriorates. In addition, as can be seen from the results in FIGS. 8 and 9 of Patent Literature 1, light is not emitted unless the heat-reducible metal is present. Thus, for the organic EL element structure described in Patent Literature 1, a heat-reducible metal is an essential component. Therefore, aside from the cathode problem, the occurrence of dark spots due to oxidation of the heat-reducible metal is another problem.

Further, in the organic EL element of Patent Literature 1, if the cathode formed from a material having a low work function such as Li is oxidized, there is also the problem that the charge transfer complex that is necessary for the element to emit light is not formed.

CITATION LIST

Patent Literature

Patent Literature 1: Japanese Patent No. 4243237

SUMMARY OF INVENTION

Technical Problem

The above-described problems are an example of the problems that are solved by the present invention. Accordingly, an example of an object of the present invention is to provide an organic EL element that is resistant to moisture and oxygen, and in which the occurrence and expansion of non-light-emitting portions such as dark spots is suppressed, as well as to provide a production method thereof.

Further, another example of an object of the present invention is to provide an organic EL element, and a production method thereof, in which oxidation of the electrodes is suppressed even if moisture and oxygen infiltrate the element.

Solution to Problem

The organic EL element of the present invention is, as described in claim 1, an organic EL element in which an organic functional layer including at least one or more light-emitting layers is arranged between a first electrode and a second electrode, the organic EL element characterized in that the organic functional layer includes a bipolar charge generation layer which generates electrons and holes, and one of the first electrode and the second electrode is a hole-receiving electrode.

The method for producing an organic EL element of the present invention is, as described in claim 12, a method for producing an organic EL element in which an organic functional layer including at least one or more light-emitting layers is arranged between a first electrode and a second electrode, the method characterized by forming a bipolar charge generation layer which generates electrons and holes in one of the layers constituting the organic functional layer, so as to use one of the first electrode and the second electrode as a hole-receiving electrode.

Figure 1:
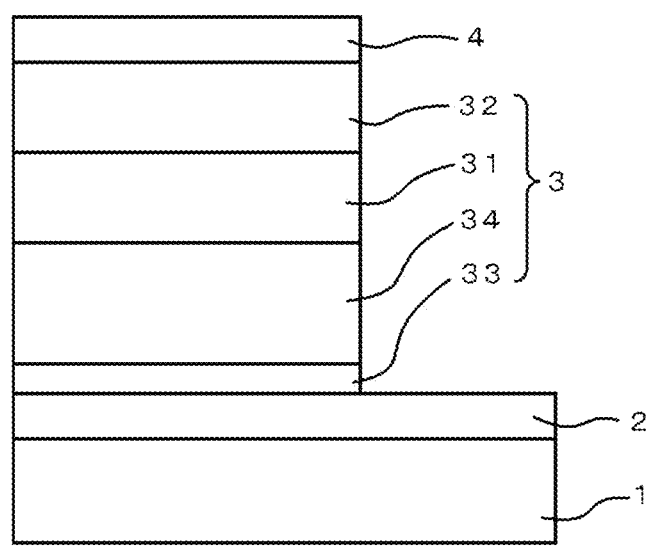
FIG. 1 is a vertical cross-sectional view of an organic EL element according to a first embodiment of the present invention.

REFERENCE SIGNS LIST 1 substrate
2 anode
3 organic functional layer
31 light-emitting layer
32 bipolar charge generation layer
33 hole injection layer
34 hole transport layer
35 charge generation promotion layer
36 second charge generation promotion layer
4 hole-receiving electrode

DESCRIPTION OF EMBODIMENTS

Organic EL elements and a production method thereof according to preferred embodiments of the present invention will now be described with reference to the accompanying drawings. However, the following embodiments in no way limit the technical scope of the present invention.

First Embodiment

As illustrated in FIG. 1, the organic EL element according to the present embodiment has a structure in which a first electrode 2 that functions as an anode, an organic functional layer 3 that includes at least one or more light-emitting layers 31, and a second electrode 4 that functions as a hole-receiving electrode are laminated on a substrate 1. The structure in which the organic functional layer 3 is arranged between the first electrode 2 and the second electrode 4 is the same as the conventional structure. However, in the present embodiment, a bipolar charge generation layer 32 that generates electrons and holes when a bias voltage is applied is arranged in the organic functional layer 3 so as to be positioned between the light-emitting layer 31 and the second electrode 4. Consequently, the second electrode 4 functions as a hole-receiving electrode that receives holes from the light-emitting layer 31, rather than as a conventional electron injection type electrode (cathode).

The layer structure per se of the organic functional layer 3 is not especially limited, and may be changed as appropriate, as long as it has at least the light-emitting layer 31 and the bipolar charge generation layer 32. For example, to promote the electroluminescence phenomenon and increase light emission efficiency, or depending on the application and the like of the element, a functional layer such as a hole injection layer, a hole transport layer, an electron injection layer, an electron transport layer, and a carrier blocking layer can be arranged. In such a case, the respective layers can be a single layer structure or a laminate structure composed of a plurality of different layers formed from different materials. In addition, an inorganic material may be included in a layer, or a layer formed from an inorganic material may be included in the laminate structure. FIG. 1 illustrates an example of the organic functional layer 3 formed from, in order from the anode 2 side, the hole injection layer 33, the hole transport layer 34, the light-emitting layer 31, and the bipolar charge generation layer 32.

The bipolar charge generation layer 32 is formed from a bipolar material that generates electrons and holes when a bias voltage is applied. Examples of such a material include bipolar organic semiconductors. The layer may also contain materials other than a bipolar material. Here, the term "bipolar organic semiconductor" refers to an organic semiconductor that can be driven by an n-channel or a p-channel such as a MOS-FET and the like.

Specifically, in other words, this is a material that can generate electrons and holes by application of an electric field, or a material that easily generates electrons and holes. This material even may be an organic semiconductor in which one or both charges are present even in a state in which an electric field is not applied, like as seen in a depression type FET.

Figure 2:
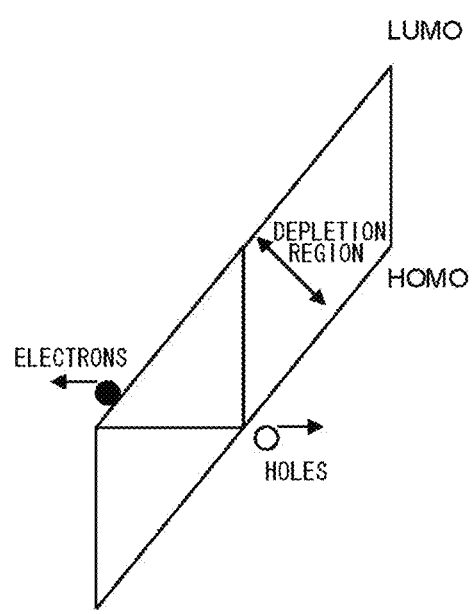
FIG. 2 is a diagram illustrating a bipolar charge generation layer of the organic EL element.

The materials forming the bipolar charge generation layer 32 are not limited, as long as the layer includes a material that has bipolarity. However, as schematically illustrated in FIG. 2, it is preferred that the bipolar charge generation layer 32 be formed from a material having a narrow difference between ionization potential and electron affinity, i.e., Ip-Ea gap (HOMO-LUMO gap). This is because if the Ip-Ea gap (HOMO-LUMO gap) is narrow, the triangular potential during application of an electric field can be reduced, the tunnel effect can easily occur, and electrons and holes are generated. More specifically, it is preferred that the Ip-Ea gap be 2.5 eV or smaller.

In addition, the bipolar charge generation layer 32 may be a mixed layer formed from a plurality of materials. Specific examples include a mixed layer of CuPc and Fl6CuPc, a mixed layer of CuPc and $C_{60}$, a mixed layer of pentacene and Fl6CuPc, and a mixed layer of pentacene and perfluoro pentacene. The mixed layer does not have to be of an organic material and an inorganic material. However, a structure formed by laminating films formed from each of these materials is not desirable. This is because the depletion region widens, so that the tunnel effect does not occur, and generation of the electrons and holes is either insufficient or does not occur. Control of the depletion level is important in the arrangement of the bipolar layer. With the structure of the organic EL element disclosed in Patent Literature 1, if the heat-reducible metal layer, which is unstable in air, is omitted from the hole-electron current conversion layer, the depletion region widens. Further, it is difficult to generate electrons at the electron transport portion (i.e., it is difficult for the charge transfer complex to form in the N-doped layer), which is a layer doped with a metal having a low-work function (generally an N-doped layer), and light is not generated.

Therefore, in the present embodiment, the respective materials are dispersed in the layer to form a mixed layer. It is preferred that such a mixed layer be formed by co-evaporation, for example. Specifically, CuPc:Fl6CuPc, CuPc:$C_{60}$, pentacene:Fl6CuPc, pentacene:perfluoro pentacene and the like. The materials may be deposited by dissolving or dispersing in a solvent, and coating. Even if the bipolar charge generation layer 32 is formed from a mixed layer composed of a plurality of organic semiconductors, among those mixed organic semiconductors, it is more preferred that the difference between the smallest Ip and the largest Ea be 2.5 eV or smaller.

Further, as the material forming the bipolar charge generation layer 32, for example, an organic semiconductor that turns into a bipolar substance by oxygen in the air can be used. Specific examples of organic semiconductors that turn into a bipolar substance by oxygen include fullerene (LUMO=4.4 eV, HOMO=6.3 eV) and a fullerene derivative (reference: A Tapponnier et al., Appl. Phys. Lett. 86, 112114 (2005)), TiOPc (LUMO=3.8 eV, HOMO=5.2 eV) (reference: H. Tada et al., Phys. Lett. 76, 873 (2000)) and the like. Since these materials hardly dissolve in a solvent, generally, deposition is performed by vacuum deposition, not by a coating method. Therefore, the bipolar charge generation layer 32 can be turned into a bipolar substance by depositing a material under a vacuum, and then exposing to an oxygen-containing gas or supplying an oxygen-containing gas. For example, the layer can be turned into a bipolar substance by exposing it to air.

Since the charge generation amount is influenced by the Ip-Ea gap and the HOMO and LUMO of the adjacent functional layer (in FIG. 1, the light-emitting layer 31), the preferred thickness of the bipolar charge generation layer 32 is appropriately adjusted based on the charge balance of the element. Further, in order for the layer to function as the bipolar charge generation layer 32, the thickness of the layer has to be at least 1 nm or more. However, if the film is too thick, the resistance value increases as well as the driving voltage increases, and accordingly, it is preferred that the thickness be 100 nm or less.

The hole-receiving electrode 4 does not inject electrons like a conventional cathode, but rather receives the holes generated by the bipolar charge generation layer 32. Therefore, it is preferred that the work function be 4.0 eV or larger. More preferably, to receive the holes from the bipolar charge generation layer 32, the material has a large Ip, and is stable in air. Specific examples include Au and Pt which are stable in air, Ag, Cr, Mo and the like which do not have insulation properties even if oxidized, Al:Nd, Ti:Al and other such alloys as materials that are stable under an air atmosphere, and conductive oxides such as ITO (Indium Tin Oxide) and IZO (Indium Zinc Oxide). These materials have a high work function (Wf) that cannot be used for a conventional electron injection type electrode (cathode). Further, when configuring as a top emission structure that extracts light from the hole-receiving electrode 4 side, a transparent material such as ITO or IZO is used. For example, when configuring as a microcavity structure that utilizes a resonance effect, a reflective material is used rather than a transparent material. Further, although not illustrated in FIG. 1, an extraction electrode (wiring electrode) for applying a bias voltage is connected to the hole-receiving electrode 4.

The material for the substrate 1 is not especially limited, as long as the element can be formed on a surface thereof. Examples of the substrate 1 include a glass substrate, a metal substrate, a resin substrate such as plastic and the like. As described below, the organic EL element according to the present embodiment can suppress the occurrence and expansion of non-light-emitting portions due to oxygen and moisture in the air even if a defective portion, such as a crack, forms in the sealing film. Consequently, the above-described advantageous effects can be optimally exhibited when a flexible substrate that is susceptible to cracks and the like in the sealing film is used.

The anode 2 uses a material having a high work function so that holes can be injected into the adjacent hole injection layer 33. Specific examples of materials that can be used include metals such as Cr, Mo, Ni, Pt, and Au, or a compound thereof, or an alloy containing any of them. For a bottom emission structure in which the light is extracted from the substrate 1 side, a transparent conductive oxide, such as ITO or IZO, is used. The thickness of the anode 2 is not especially limited. Further, although not illustrated in FIG. 1, an extraction electrode (wiring electrode) for applying a bias voltage is connected to the anode 2.

Examples of materials that can be used for the light-emitting layer 31 include, but are not limited to, fluorescent organic metal compounds such as a tris(8-hydroxyquinolinate) aluminum complex ($Alq_3$); fluorescent organic materials including an aromatic dimethylidine compound such as 4,4'-bis(2,2'-diphenylvinyl)-biphenyl (DPVBi), a styrylbenzene compound such as 1,4-bis(2-methylstyryl)benzene, a triazole derivative such as 3-(4-biphenyl)-4-phenyl-5-t-butylphenyl-1,2,4-triazole (TAZ), a anthraquinone derivative, a fluorenone derivative; and phosphorescent organic materials including a polymeric material such as polyparaphenylene vinylene (PPV), polyfluorene, and polyvinylcarbazole (PVK) materials, and a platinum complex and an iridium complex.

The hole injection layer 33 and the hole transport layer 34 can be formed from a material having high hole transport properties. Examples of materials that can be used include a phthalocyanine compound such as copper phthalocyanine (CuPc), a starburst type amine such as m-MTDATA, a multimer of a benzidine type amine, an aromatic tertiary amine such as 4,4'-bis[N-(l-naphtyl)-N-phenylamino]-biphenyl (NPB) and N-phenyl-p-phenylenediamine (PPD), a stilbene compound such as 4-(di-P-tolylamino)-4'-[4-(di-P-tolylamino)styryl]stylbenzene, a triazole derivative, and a styrylamine compound. It is also possible to use a polymer dispersed material in which a low molecular weight material is dispersed in a high molecular weight material such as polycarbonate. However, the material is not limited to these examples.

The electron injection layer and the electron transport layer can be formed from a material having high electron transport properties. Examples of materials that can be used include an organic material such as a silacyclopentadiene (silole) derivative including PyPySPyPy, a nitro-substituted fluorenone derivative, and an anthraquinodimethane derivative, a metal complex of an 8-quinolinole derivative such as tris(8-hydroxyquinolinate)aluminum ($Alq_3$), a metal phthalocyanine, a triazole compound such as 3-(4-biphenyl)-5-(4-t-butylphenyl)-4-phenyl-1,2,4-triazole (TAZ), and an oxadiazole compound such as 2-(4-biphenylyl)-5-(4-t-butyl)-1,3,4-oxadiazole (PBD). However, the material is not limited to these examples.

When providing a sealing film, the sealing film can be formed from, for example, an inorganic material having low permeability of water vapor, and oxygen. A sealing structure can be used that, like those used conventionally, is formed by vapor deposition, for example, using a silicon nitride (SiNx), a silicon nitride oxide (SiOxNy), an aluminum oxide (AlOx), an aluminum nitride (AlNx) and the like. However, since the organic EL element according to the present embodiment is stable in air, it does not require robust sealing like those conventionally required, a simple sealing structure may be employed. In this case, there is the advantage that a reduction in production costs can be achieved. Examples of simple sealing structures include thin-film structure of a sealing film, a solid sealing structure that does not use a sealing film (Japanese Patent Application Laid-Open No. Hei. 5-182759 etc.), and a structure that is protected by a polymeric resin layer having a comparatively large gas permeability (epoxy resins etc.). Further, a hollow sealing structure that includes a small amount of a desiccant may also be used.

Figure 3:
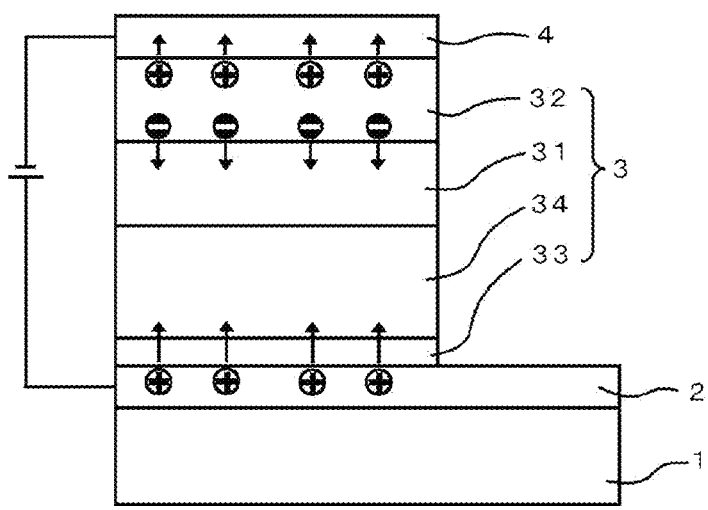
FIG. 3 is a schematic diagram illustrating the flow of holes and electrons in the above organic EL element.

When a bias voltage is applied on the organic EL element having the above-described structure, as schematically illustrated in FIG. 3, holes are injected from the anode 2 into the hole injection layer 33, and are supplied via the adjacent hole transport layer 34 to the light-emitting layer 31. On the other hand, holes and electrons are generated at the bipolar charge generation layer 32 to which an electric field was applied. The generated holes are received by the hole-receiving electrode 4, and the generated electrons are supplied to the light-emitting layer 31. Holes and electrons recombine in the light-emitting layer 31, whereby light is generated.

Figure 4:
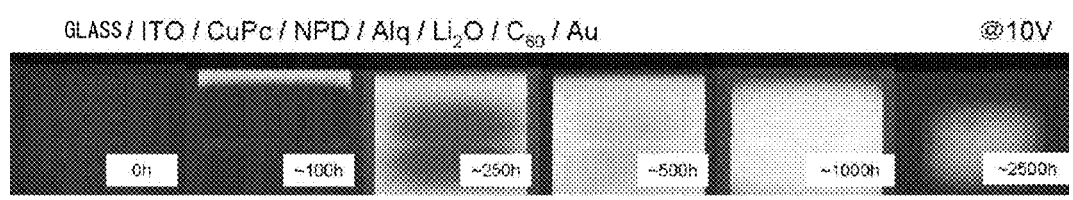
FIG. 4 is image data that captures the light emitting state when the organic EL element is exposed to air.

The image data shown in FIG. 4 is an example of the light-emitting state of the element captured over the elapsed time shown in the figure when a layer corresponding to the bipolar charge generation layer 32 is formed using a fullerene, which is an organic semiconductor, and that fullerene is subsequently turned into a bipolar substance using oxygen. Specifically, a fullerene, which is not usually bipolar, was deposited under a vacuum, and turned into a bipolar substance by exposing to air, for example. More specifically, after the anode 2, the hole injection layer 33, the hole transport layer 34, the light-emitting layer 31, and the electron injection layer were formed on a glass substrate 1, a fullerene was deposited by vapor deposition under a vacuum, for example, and then the hole-receiving electrode 4 was formed. Normally, the resultant structure is sealed. However, in this case the element was left in air without forming a sealing film, and a bias voltage was applied. The materials used for the anode/the hole injection layer/the hole transport layer/the light-emitting layer/the electron injection layer/the bipolar charge generation layer/the hole-receiving electrode, respectively, were ITO (110)/CuPc (25)/αNPD (45)/Alq-(30)/$Li_2O$ (1)/$C_{60}$ (25)/Au (80), respectively. The numerals in the brackets represent the film thickness (units: nm). This test corresponds to the below-described Example 1.

As illustrated in FIG. 4, light emission was not obtained at an initial stage (0 h) where the fullerene had not yet turned into a bipolar substance. However, as time progresses, the light-emitting region formed and expanded. This is because although the upper face of the bipolar charge generation layer 32 is covered with the Au electrode 4, since a sealing film is not formed, both side edge faces are exposed to an air atmosphere, so that oxygen infiltrates from the side edge faces and the fullerene gradually turns into a bipolar substance. Further, the entire face of the light-emitting regions was emitting light after about 500 h, and oxidation degradation of the electrode was suppressed even after 2,500 h, with light continuing to be emitted. Since light emission is continuing until 2,500 h without sealing, if sealing was applied, an even longer life could be expected. Here, the above-described "light-emitting region" is a region where, observed from the face from which light is extracted, the anode 2, the light-emitting layer 31, and the hole-receiving electrode 4 are stacked.

Figure 5:
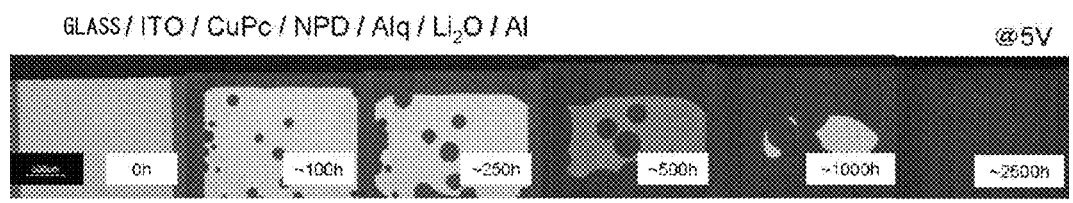
FIG. 5 is image data that captures the light emitting state when an organic EL element having a conventional structure is exposed to air.

On the other hand, the image data shown in FIG. 5 is an example of the result when an organic EL element having a conventional structure is produced and the same air atmosphere exposure test is carried out. Specifically, an organic EL element having a conventional structure was produced by laminating an anode, a hole injection layer, a hole transport layer, a light-emitting layer, an electron injection layer, and a cathode in order on a glass substrate. Then, the element was left in air without forming a sealing film, and a bias voltage was applied. The materials used for the anode/the hole injection layer/the hole transport layer/the light-emitting layer/the electron injection layer/the cathode, respectively, were ITO/CuPc/αNPD/$Alq_3$/$Li_2O$/Al, respectively.

As illustrated in FIG. 5, the organic EL element having a conventional structure emitted light from the entire face at an initial stage (0 h). However, as time progresses, dark spots formed and expanded. At 2,500 h, the entire face did not emit light. This is because the cathode (in particular, the interface with the electron injection layer) had oxidized and degraded, so that electrons could no longer be injected.

It is clear from the results of FIGS. 4 and 5 that an organic EL element that uses an organic semiconductor that turns into a bipolar substance by oxygen exhibits a behavior against the oxygen and moisture in the air that is the complete opposite of a conventional element. Specifically, while the oxygen and moisture in the air are a degrading factor that inhibits light emission in a conventional organic EL element, in the organic EL element according to the present embodiment the oxygen and moisture in the air act as an activating factor that promotes light emission.

Thus, according to the present embodiment, in an organic EL element produced by laminating, in order, the first electrode 2, the organic functional layer 3, and the second electrode 2, the electrode function of the second electrode 4 can be made to change from a conventional electron injection electrode to a hole-receiving electrode by arranging the bipolar charge generation layer 32 that generates electrons and holes between the light-emitting layer 31 and the second electrode 4. Consequently, the second electrode 4 can be formed using a material that has a high work function. To improve the hole reception function, it is, if anything, more preferred that the material has a high work function. As a result, the resistance of the element to oxygen and moisture is increased, and the occurrence and expansion of non-light-emitting portions such as dark spots is suppressed. More specifically, as a result of enabling the first and second electrodes to both be formed from a material having a high work function, the resistance to oxygen and moisture can be increased.

Especially, if a material having an electrode work function of 4.0 eV or larger is selected, oxidation can be more reliably suppressed.

Further, according to the present embodiment, since the bipolar charge generation layer 32 is formed by using a bipolar material that generates electrons and holes when a bias voltage is applied, the bipolar charge generation layer 32 can be formed as a single layer. In particular, by using an organic semiconductor that turns into a bipolar substance by oxygen, the oxygen can serve as an activating factor that promotes light emission. This is an action that would absolutely not be possible in an organic EL element having a conventional structure. For example, when forming a full color display device by arranging on a substrate organic EL elements that respectively emit R (red), G (green), and B (blue) light, in some cases a partition portion is formed that separates the respective elements. The partition portions can be utilized for separated coating of the RGB element by a coating method. Even in such a structure, oxygen can permeate and be supplied by using for the partition potion material a material that has a large gas permeation property, for example, a resist that contains a fluorine component. Further, oxygen can also be supplied by configuring so that part of the edge face of the bipolar charge generation layer 32 is exposed.

Second Embodiment

Next, an example of the method for producing the organic EL element having the structure illustrated in FIG. 1 will be described with reference to FIG. 6. However, as described in detail above, the organic EL element according to the present embodiment can be produced using various materials. Therefore, in the following, for ease of explanation, an example is described in which fullerene was used for the material for the bipolar charge generation layer 32, and the bipolar charge generation layer 32 was turned into a bipolar substance by oxygen.

Figure 6:
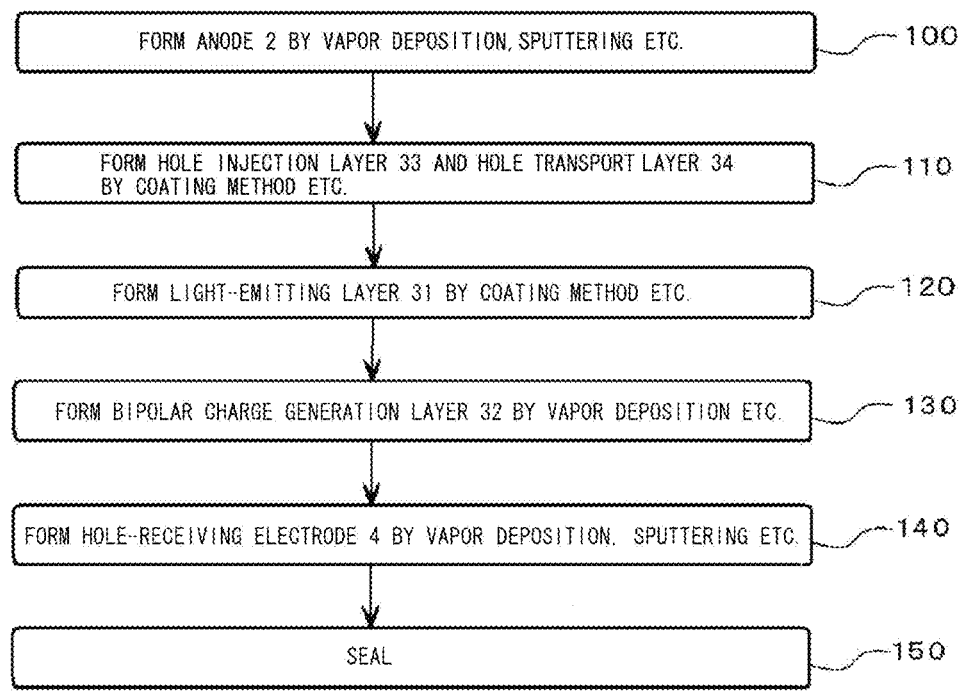
FIG. 6 is a flowchart illustrating the preferred production steps of the above organic EL element.

As illustrated in FIG. 6, using a glass substrate for the substrate 1, the anode 2 (for example, ITO) is deposited (process 100) as a transparent material on the substrate 1 by vacuum deposition or a sputtering method, for example. The patterning of the electrode can be carried out by photolithography, for example. For a passive element, the electrode is formed in a stripe shape, and for an active element, the anode 2 is formed in an island shape connected to each drive circuit.

Next, a liquid material of the hole injection layer 33 is coated and dried to form the layer (process 110). Although the coating method is not limited, for example, an inkjet method can be employed. The hole transport layer 34 is also deposited by the same coating method. Further, the light-emitting layer 31 is also deposited by the same coating method (process 120). The film thickness can be regulated based on the coating amount of the liquid material, for example. Next, using a vapor deposition method, for example, the bipolar charge generation layer 32 is deposited under a vacuum (process 130). If forming an electron injection layer between the light-emitting layer 31 and the bipolar charge generation layer 32, this layer can also be deposited by the same vapor deposition method. In addition, the hole-receiving electrode 4 is deposited by a vacuum deposition or a sputtering method, for example (process 140). The patterning of the hole-receiving electrode 4 can be carried out using a mask, such as a metal mask, for example. For example, for a passive element, the hole-receiving electrode 4 can be patterned in a stripe shape, and for an active element, patterning is not carried out, rather a so-called "solid electrode" can be used. Finally, the element is optionally sealed, and the electric circuits are produced to complete the organic EL element (process 150).

When forming the bipolar charge generation layer 32 with a plurality of materials, the layer can be formed by a co-evaporation method, for example. Further, when forming the bipolar charge generation layer 32 with a material that turns into a bipolar substance by oxygen, the process can be carried out by forming up to the hole-receiving electrode 4, and then turning the layer into a bipolar substance by exposing to an oxygen-containing gas (for example, air). Obviously, the bipolar charge generation layer 32 can be turned into the bipolar substance by exposing it to an oxygen-containing gas before forming the hole-receiving electrode 4. Further, organic vapor phase deposition (OVPD) can be employed as the method for forming the bipolar charge generation layer 32. By including oxygen in the carrier gas, the oxygen can be supplied while depositing the layer.

Third Embodiment

Figure 7:
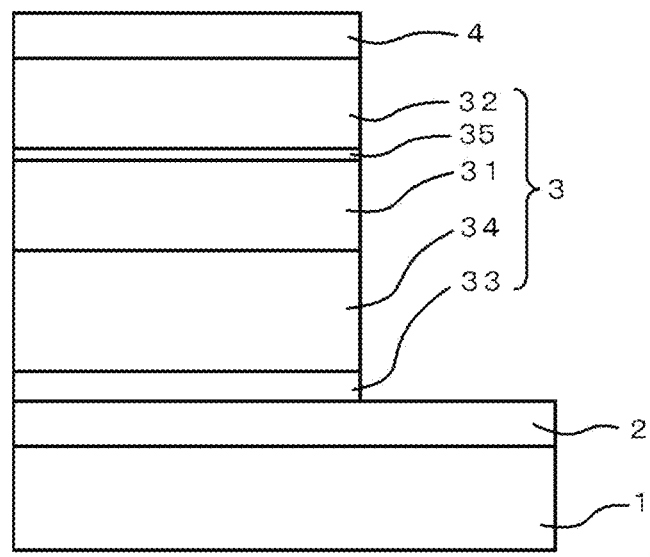
FIG. 7 is a vertical cross-sectional view of an organic EL element according to a third embodiment of the present invention.

The present embodiment is a modified example of the first embodiment illustrated in FIG. 1. Specifically, as illustrated in FIG. 7, the third embodiment has the same structure as illustrated in FIG. 1, except that the charge generation promotion layer 35 is arranged between the light-emitting layer 31 and the bipolar charge generation layer 32. This charge generation promotion layer 35 is arranged in order to promote charge generation inside the bipolar charge generation layer 32. The charge generation promotion layer 35 can be formed by, for example, a vapor deposition method using a material such as LiF or $MgF_2$. The electron injection layer formed from $Li_2O$ illustrated in FIG. 4 and Example 1 also functions as the charge generation promotion layer 35. Even in such a structure the same effects as those in the above-described embodiments can be obtained. In addition, defects such as shorts can be prevented by arranging the charge generation promotion layer 35 and increasing the film thickness between the first electrode 2 and the second electrode 4.

Fourth Embodiment

Figure 8:
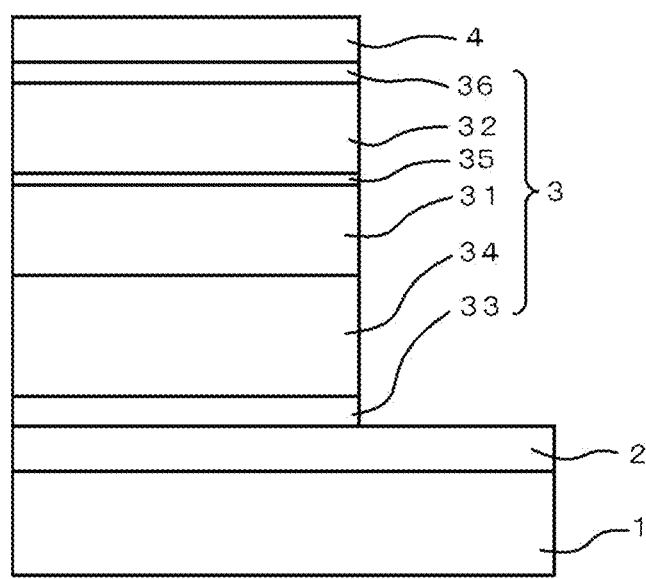
FIG. 8 is a vertical cross-sectional view of an organic EL element according to a fourth embodiment of the present invention.

The present embodiment is a modified example of further modifying the third embodiment illustrated in FIG. 7. Specifically, as illustrated in FIG. 8, the present embodiment has the same structure as illustrated in FIG. 7, except that a second charge generation promotion layer 36 is arranged between the bipolar charge generation layer 32 and the hole-receiving electrode 4. The second charge generation promotion layer 36 is also arranged in order to promote charge generation inside the bipolar charge generation layer 32. Obviously, the first charge generation promotion layer 35 may be omitted. The charge generation promotion layer 36 according to the present embodiment can be formed by, for example, a vapor deposition method using a material such as $MoO_3$, $V_2O_5$, and HAT-CN. Even in such a structure the same effects as those in the above-described embodiments can be obtained.

Although the above-described first to fourth embodiments were described as having a structure in which a single light-emitting layer 31 was arranged in the organic functional layer 3, the present invention is not limited to this. A plurality of light-emitting layers 31 may be arranged in the organic functional layer 3. More specifically, a multi-photon structure may be employed, in which a plurality of light-emitting units configured from hole transport layer 34/light-emitting layer 31/electron transport layer, for example, are stacked. Even in such a structure the same effects as those in the above-described embodiments can be obtained.

Further, although the above-described first to fourth embodiments were described as having a structure in which the anode 2 is arranged on the substrate 1 side, the present invention is not limited to this. The hole-receiving electrode 4 can be arranged on the substrate 1 side.

The technology according to the above-described embodiments can be applied to organic devices such as organic EL displays, organic TFTs, and solar cells. Further, the action of emitting light due to turning into a bipolar substance by oxygen can also be applied to an oxygen detector. However, the applications are not limited thereto.

In the above, the present invention was described in detail based on the specific embodiments. However, a person having ordinary knowledge in the art pertaining to the subject technical field would clearly understand that various substitutions, modifications, changes and the like relating to the form and details of the invention could be made that fall within the spirit and scope of the invention as described in the claims. Therefore, the scope of the present invention is not limited to the above embodiments and the accompanying drawings, and should be construed based on the claims and equivalent subject matter thereto.

Example 1

HTL/EML/Bipolar Charge Generation Layer/Hole-Receiving Electrode

An ITO anode 2 was formed on a glass substrate 1 by a sputtering method based on a known technology. Then, CuPc as the hole injection layer 33, αNPD as the hole transport layer 34, $Alq_3$ as the light-emitting layer 31, LiF as the charge generation promotion layer 35 for electron injection, $C_{60}$ as the bipolar charge generation layer 32, and Au as the hole-receiving electrode 4 were deposited by a vacuum deposition method to produce an organic EL element.

As also shown in FIG. 4, when the organic EL element was left in air (22° C., 50% RH) while still not sealed, only the regions where oxygen had infiltrated started to emit light. Although shown in Example 2, this mechanism was found to be due to oxygen infiltrating into the device from the edges, so that the $C_{60}$ turned into a bipolar substance. Specifically, it is thought that at the bipolar $C_{60}$ regions into which oxygen had infiltrated, electrons were generated on the $Alq_3$ side that is below the $C_{60}$, and holes were generated on the Au side that is above the $C_{60}$. At this stage, Au does not inject electrons, but rather plays the role of receiving holes.

Subsequently, all of the 2 mm×2 mm light-emitting regions were emitting light at about 500 h, and a favorable light emission state was maintained even after 1,000 h or longer, which is when in the conventional structure illustrated in FIG. 5, the non-light-emitting region undergoes significant expansion. Thus, an effect of suppressing the expansion of the non-light-emitting portions could be confirmed. Obviously, an even greater light emission time can be obtained if the organic EL element is sealed.

Example 2

HTL/EML/Bipolar Charge Generation Layer/HTL/Hole-Receiving Electrode

In Example 2, an experiment was conducted to prove whether $C_{60}$ infiltrated with oxygen actually turned into a bipolar charge generation layer and whether Au was acting as a hole-receiving electrode 4. An organic EL element was produced in which αNPD as the charge generation promotion layer 36 was inserted between the $C_{60}$ of the bipolar charge generation layer 32 and the Au acting as the hole-receiving electrode 4. Since the αNPD of the charge generation promotion layer 36 has poor electron transport properties, in this structure electrons were not injected from the Au. The production method was carried out as follows.

An ITO anode 2 was formed on a glass substrate 1 by a sputtering method based on a known technology. Then, CuPc as the hole injection layer 33, αNPD as the hole transport layer 34, $Alq_3$ as the light-emitting layer 31, LiF as the charge generation promotion layer 35 for electron injection, $C_{60}$ as the bipolar charge generation layer 32, αNPD as the charge generation promotion layer 36 for hole transport and Au as the hole-receiving electrode 4 were deposited by a vacuum deposition method to produce an organic EL element.

Figure 9:
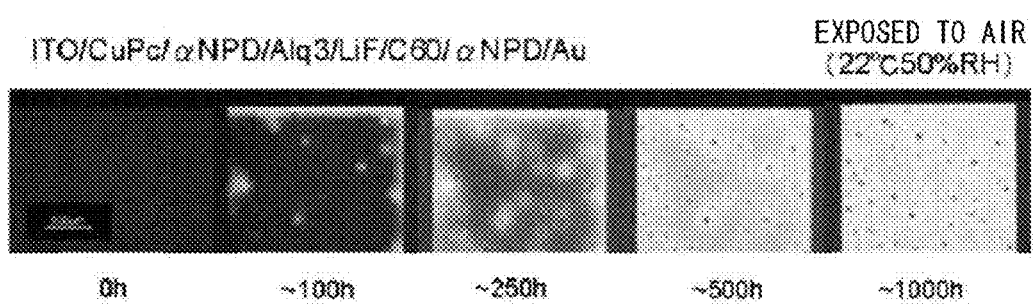
FIG. 9 is image data that captures the light emitting state when the organic EL element of Example 2 according to the above fourth embodiment is exposed to air.

As shown in FIG. 9, when the organic EL element was left in air (22° C., 50% RH) while still not sealed, oxygen infiltrated into the device from the edges, so that like in Example 1, only the regions where oxygen had infiltrated started to emit light. Since the NPD of the charge generation promotion layer 36 had poor electron transport properties, electrons were not injected from the Au, showing that the Au was acting as the hole-receiving electrode 4 and the $C_{60}$ was acting as the bipolar charge generation layer 32. It is thought that at the bipolar $C_{60}$ regions into which oxygen had infiltrated, electrons were generated on the $Alq_3$ side that is below the $C_{60}$ holes were generated on the side above the $C_{60}$ and transmitted via the αNPD to the Au of the hole-receiving electrode 4.

Subsequently, all of the 2 mm×2 mm light-emitting regions were emitting light at about 500 h, and a good light emission state was maintained even after 1,000 h or longer, which is when in a conventional element, the non-light-emitting region undergoes significant expansion. Thus, an effect of suppressing the expansion of the non-light-emitting portion could be confirmed. Obviously, an even greater light emission time can be obtained if the organic EL element is sealed.

The invention claimed is:

1. An organic EL element comprising an organic functional layer including a light-emitting layer arranged between a first electrode and a second electrode, wherein
    the organic functional layer includes a bipolar charge generation layer which generates electrons and holes,
    one of the first electrode and the second electrode is a hole-receiving electrode, and
    the bipolar charge generation layer and a charge generation promotion layer are stacked between the hole-receiving electrode and the light-emitting layer.

2. The organic EL element according to claim 1, the charge generation promotion layer is stacked between the hole-receiving electrode and the bipolar charge generation layer.

3. The organic EL element according to claim 2, the charge generation promotion layer is a HAT-CN.

4. The organic EL element according to claim 3, having a multi-photon structure with the plurality of light-emitting layers stacked.

5. The organic EL element according to claim 4, wherein one of the light-emitting layers includes a phosphorescent material.

6. An organic device having the organic EL element according to claim 1, wherein
    the organic EL element is formed on a surface of a resin substrate.

7. An organic device having the organic EL element according to claim 2, wherein
    the organic EL element is formed on a surface of a resin substrate.

8. An organic device having the organic EL element according to claim 3, wherein
    the organic EL element is formed on a surface of a resin substrate.

9. An organic device having the organic EL element according to claim 4, wherein
    the organic EL element is formed on a surface of a resin substrate.

10. An organic device having the organic EL element according to claim 5, wherein
    the organic EL element is formed on a surface of a resin substrate.

* * * * *